(12) United States Patent
Sekiguchi

(10) Patent No.: US 8,050,105 B2
(45) Date of Patent: Nov. 1, 2011

(54) FLOTOX-TYPE EEPROM

(75) Inventor: Yushi Sekiguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 236 days.

(21) Appl. No.: 12/449,169

(22) PCT Filed: Jan. 28, 2008

(86) PCT No.: PCT/JP2008/051213
§ 371 (c)(1),
(2), (4) Date: Jul. 27, 2009

(87) PCT Pub. No.: WO2008/093640
PCT Pub. Date: Aug. 7, 2008

(65) Prior Publication Data
US 2010/0002524 A1    Jan. 7, 2010

(30) Foreign Application Priority Data

Jan. 29, 2007  (JP) ................... 2007-018053
Mar. 1, 2007   (JP) ................... 2007-051641

(51) Int. Cl.
*G11C 11/34* (2006.01)
(52) U.S. Cl. ............... 365/185.26; 257/314; 257/239

(58) Field of Classification Search ........... 365/185.26; 257/314, 239
See application file for complete search history.

(56) References Cited

U.S. PATENT DOCUMENTS

| | | | |
|---|---|---|---|
| 5,471,422 A | * | 11/1995 | Chang et al. ........... 365/185.26 |
| 6,628,549 B2 | | 9/2003 | Shukuri et al. |
| 2004/0264227 A1 | | 12/2004 | Kojima et al. |

FOREIGN PATENT DOCUMENTS

| | | |
|---|---|---|
| JP | 8180696 A | 7/1996 |
| JP | 9223780 A | 8/1997 |
| JP | 10-056091 A | 2/1998 |
| JP | 2001-257324 A | 9/2001 |
| JP | 2005-020349 A | 1/2005 |

* cited by examiner

*Primary Examiner* — Son Dinh
*Assistant Examiner* — Nam Nguyen
(74) *Attorney, Agent, or Firm* — Rabin & Berdo, P.C.

(57) ABSTRACT

In designing a FLOTOX EEPROM of a dual cell type, a consideration should be given to the layout of cells for microminiaturization of the FLOTOX EEPROM. The FLOTOX EEPROM of the dual cell type includes two paired floating gates (25*a*, 25*b*), two tunnel windows (33*a*, 33*b*) a shared source (27), a shared control gate (26), select gates (29*a*, 29*b*), and a shared drain 28. Thus, a higher reliability design and a higher breakdown voltage design are achieved for the FLOTOX EEPROM of the dual cell type.

11 Claims, 6 Drawing Sheets

FIG. 2
(A) WRITE
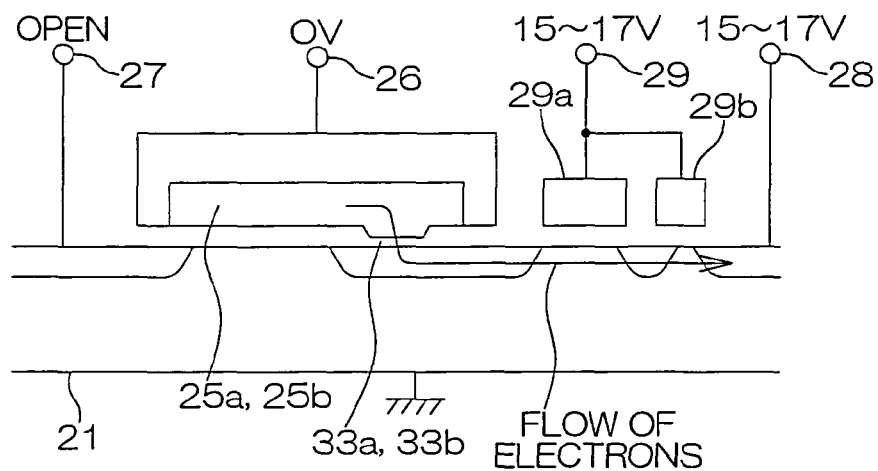
(B) ERASE
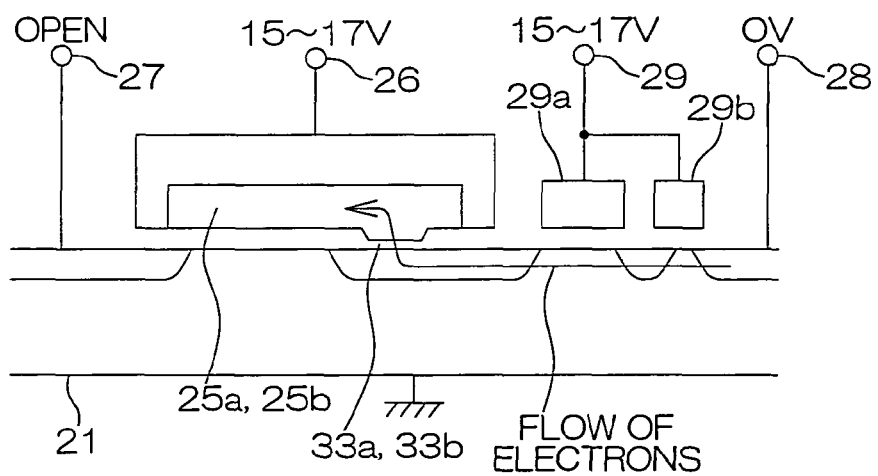
(C) READ
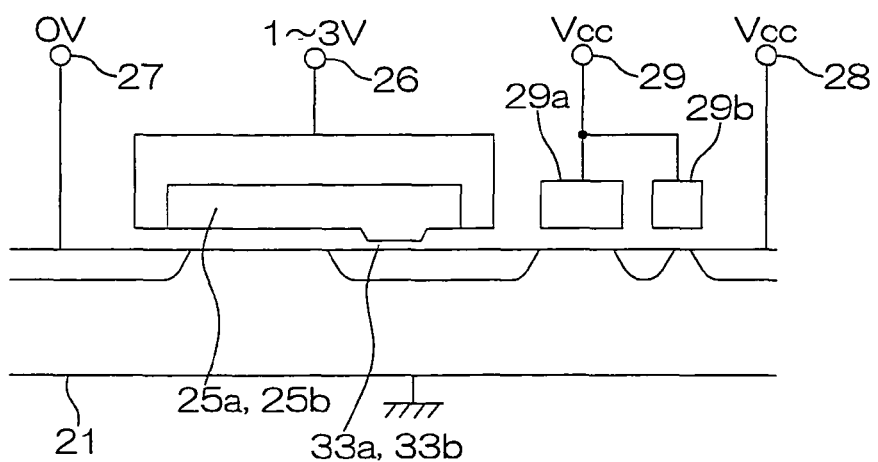

FIG. 5
(A) <ERASE>
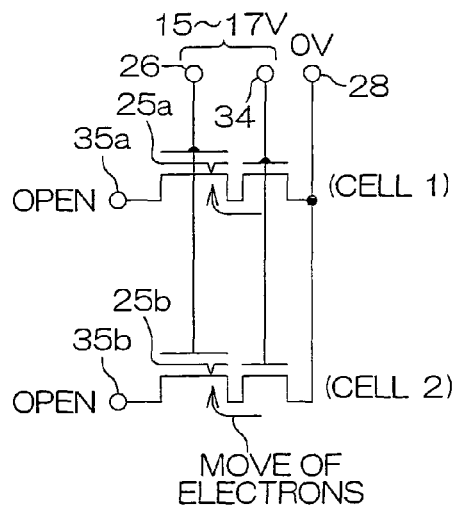
(B) <WRITE>
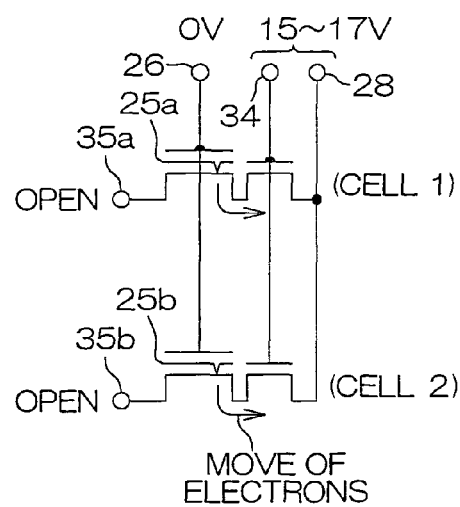
(C) <ORDINARY READ>
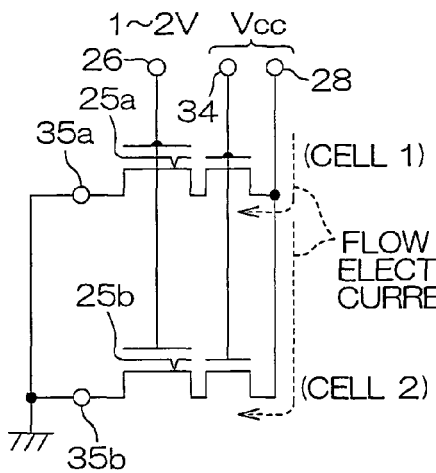
(D) <TEST READ>
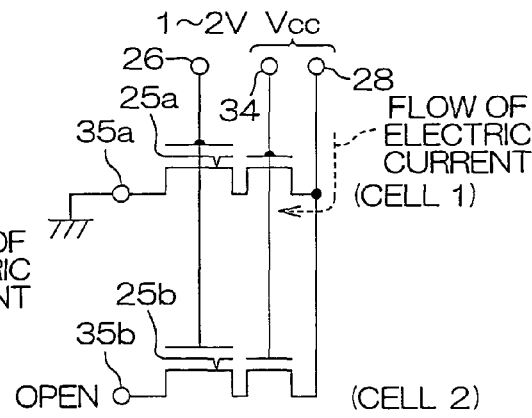

FLOTOX-TYPE EEPROM

TECHNICAL FIELD

The present invention relates to a FLOTOX EEPROM and, particularly, to an EEPROM of a dual cell type including two paired cells and adapted to store the same data in the two cells.

BACKGROUND ART

Electrically writable and rewritable EEPROMs find a wide range of applications because of their capabilities of on-board rewrite and rewrite in units of page and byte. Therefore, the EEPROMs require a highly reliable design and microminiaturization.

For improvement of the reliability, a FLASH is proposed, which includes a storage cell and an additional verify cell for single data so that data write and erasure can be easily verified (see Patent Document 1). A conceivable approach to the highly reliable design of the EEPROM is to employ a dual cell system adapted to store the same data in two cells.
Patent Document 1: JP-A-HEI8 (1996)-180696

DISCLOSURE OF THE INVENTION

Problems to be Solved by the Invention

If the EEPROM of the dual cell type is designed so as to store the same data in two cells simply disposed side by side, the reliability is indeed improved, but it is impossible to reduce a cell area, failing to achieve the microminiaturization of the EEPROM. Therefore, a consideration should be given to the layout of the cells in the EEPROM of the dual cell type.

More specific description will be given with reference to the following drawings.

FIG. 6(A) is a schematic plan view showing a cell structure of a prior art FLOTOX EEPROM. FIG. 6(B) is an X-X sectional view in FIG. 6(A), and FIG. 6(C) is a Y-Y vertical sectional view in FIG. 6(A).

The EEPROM includes a cell transistor 3 and a select transistor 4 which are provided in regions of a p-type silicon substrate 1 isolated from each other by a LOCOS oxide film 2 formed, for example, in a surface portion of the p-type silicon substrate 1 by a LOCOS method. These transistors each include a drain 5, a source 6, a floating gate 7 and a control gate 8 provided between the drain 5 and the source 6, and a select gate 9 provided between he floating gate 7 and the drain 5. A part of an insulating film 10 provided between the floating gate 7 and the drain 5 has a smaller thickness on the order of about 100 to about 200 Å, and is defined as a tunnel window 11. Electrons are injected into and extracted from the floating gate 7 via the tunnel window 11.

That is, the FLOTOX EEPROM requires a higher breakdown voltage design because FN tunnel current is used for a write operation. Therefore, a higher impurity concentration p+ region 12 called "channel stopper" is provided below the LOCOS oxide film 2 to increase an isolation breakdown voltage.

In the cell structure of the EEPROM, the channel stopper region 12 should be spaced a predetermined distance 13 from the drain 5 (drain junction region) Without the provision of the distance 13, the breakdown voltage of the EEPROM is reduced. This makes it impossible to apply a voltage required for the data write, so that the EEPROM fails to function as a memory. Therefore, the provision of the distance 13 between the channel stopper 12 and the drain 5 hinders the reduction in cell area.

Therefore, where the EEPROM employs the dual cell system adapted to store the same data in the two cells for the higher reliability design, a consideration should be given to the layout, rather than employing a configuration such that the two cells are simply juxtaposed. The simple juxtaposition of the two cells requires a cell area which is twice that of the prior art EEPROM. Even though the reliable design is achieved, it is impossible to reduce the cell area (chip area).

In view of the foregoing, it is a principal object of the present invention to provide a FLOTOX EEPROM which employs the dual cell system for higher reliability, and has a reduced cell area.

It is another object of the present invention to provide an EEPROM of the dual cell type which includes two paired independently-readable cells.

It is further another object of the present invention to provide a FLOTOX EEPROM of the dual cell type which includes two paired independently-readable cells in which sources are respectively provided.

It is still another object of the present invention to provide a method of driving a FLOTOX EEPROM of the dual cell type.

It is further another object of the present invention to provide a method of driving a FLOTOX EEPROM of the dual cell type and a method of verifying the operation of the FLOTOX EEPROM of the dual cell type.

Means for Solving the Problems

According to an inventive aspect as set forth in claim 1 to achieve the aforementioned objects, there is provided a FLOTOX EEPROM of a dual cell type which stores the same data in two cells, the FLOTOX EEPROM including: two paired floating gates (25a, 25b); two tunnel windows (33a, 33b) respectively provided in association with the floating gates; a single control gate (26) shared by the two floating gates; a select gate (29) shared by the two floating gates and cooperative with the control gate to select at least one of the two floating gates; a single drain (28) shared by the two floating gates; and a single source (27) shared by the two floating gates.

The parenthesized alphanumeric characters denote corresponding structural elements in embodiments to be described later. This definition is applicable to the following description in this section.

With this arrangement, the drain region (28), which is provided in a select transistor (24) requiring a higher breakdown voltage design, is shared by the two cells. This reduces the size of the drain region as compared with a case in which separate drains are provided for the two cells. Thus, the cells can be each configured such that the drain region (28) does not contact a channel stopper region (30) provided below a LOCOS oxide film (22). Therefore, the drain has a sufficient breakdown voltage and yet has a minimum area.

Further, the cell area can be optimized by reducing the sizes of other portions of the two cells according to breakdown voltage requirements.

According to an inventive aspect as set forth in claim 2, the two paired floating gates (25a, 25b) are arranged in a direction which crosses a direction extending between the drain (28) and the source (27), and the select gate (29) includes first and second band lines (29a, 29b) each extending generally parallel to the arrangement direction of the two floating gates in the FLOTOX EEPROM of the dual cell type of claim 1. The first band line (29a) includes a greater line width portion opposed to one (25a) of the two floating gates, and a smaller line width portion opposed to the other floating gate (25b). Further, the second band line (29b) includes a smaller line width portion opposed to the one floating gate (25a), and a greater line width portion opposed to the other floating gate (25b).

With this arrangement, the two floating gates (25a, 25b) are arranged in the direction crossing the direction extending between the drain (28) and the source (27), so that the shared drain region (28) has a smaller size as measured in the crossing direction. Further, the select gate (29) includes the first band line (29a) and the second band line (29b), so that the two cells can be handled as independent cells from which data is read individually by causing punch-through below parts of the band lines (each having a smaller width).

According to an inventive aspect as set forth in claim 3, there is provided a method of driving the EEPROM of claim 1 or 2, the method including the steps of: applying a higher voltage to the control gate (26) and the select gate (29), and biasing the drain (28), the source (27) and a semiconductor substrate (21) at a lower voltage to inject electrons into the two floating gates (25a, 25b) via the tunnel windows (33a, 33b) for an erase operation; applying a higher voltage to the drain (28) and the select gate (29), biasing the control gate (26) and the semiconductor substrate (21) at a lower voltage and opening the source (27) to extract electrons from the two floating gates (25a, 25b) via the tunnel windows (33a, 33b) for a write operation; and applying an operation voltage to the select gate (29) and the drain (28), applying a sense voltage to the control gate (26) and biasing the source (27) and the semiconductor substrate (21) at a ground potential to detect current for a read operation.

With this arrangement, the erase operation, the write operation and the read operation can be properly performed on the two paired floating gates (25a, 25b) by controlling the voltages of the control gate (26), the select gate (29), the drain (28) and the source (27) shared by the two paired floating gates (25a, 25b).

According to an inventive aspect as set forth in claim 4, there is provided a method of driving the EEPROM of claim 2, comprising the step of: performing a read operation on one of the two floating gates (25a, 25b) by biasing the source (27) and the semiconductor substrate (21) at a ground potential, applying an operation voltage to the drain (28), applying the ground potential to one of the first band line (29a) and the second band line (29b), and applying the operation voltage to the other band line.

This method makes it possible to operate the two cells independently.

According to an inventive aspect as set forth in claim 5, there is provided a FLOTOX EEPROM of a dual cell type which stores the same data in two cells, the FLOTOX EEPROM including: two paired floating gates (25a, 25b); two tunnel windows (33a, 33b) respectively provided in association with the floating gates; a single control gate (26) shared by the two floating gates; a single select gate (34) shared by the two floating gates and cooperative with the control gate to select at least one of the two floating gates; a single drain (28) shared by the two floating gates; and two sources (35a, 35b) respectively provided in association with the floating gates.

With this arrangement, the drain region (28), which is provided in a select transistor (24) requiring a higher breakdown voltage design, is shared by the two cells. This reduces the size of the drain region as compared with a case in which separate drains are provided for the two cells. Thus, the cells can be each configured such that the drain region (28) does not contact a channel stopper region (30) provided below a LOCOS oxide film (22). Therefore, the drain has a sufficient breakdown voltage and yet has a minimum area.

Further, the cell area can be optimized by reducing the sizes of other portions of the two cells according to the breakdown voltage requirements.

Since the sources (35a, 35b) are respectively provided for the two cells, the two cells can be handled as independent cells. Therefore, the data can be read individually from the two cells. This makes it possible to verify if the two cells normally operate before shipment.

According to an inventive aspect as set forth in claim 6, the two paired floating gates (25a, 25b) may be arranged in a direction which crosses directions extending between the drain (28) and the sources (35a, 35b).

With this arrangement, the shared drain (28) has a smaller size as measured in the crossing direction, because the two floating gates (25a, 25b) are arranged in the direction crossing the directions extending between the drain (28) and the sources (35a, 35b). Further, it is possible to reduce the cell area while maintaining the breakdown voltages of the floating gates (25a, 25b) and the sources (35a, 35b) at required levels.

According to an inventive aspect as set forth in claim 7, there is provided a method of driving the EEPROM of claim 5 or 6, the method including the steps of: applying a higher voltage to the control gate (26) and the select gate (34), keeping the drain at a lower voltage, and opening the two sources (35a, 35b) to inject electrons into the two floating gates (25a, 25b) via the tunnel windows (33a, 33b) for an erase operation; applying a higher voltage to the drain (28) and the select gate (34), keeping the control gate (26) at a lower voltage and opening the two sources (35a, 35b) to extract electrons from the two floating gates (25a, 25b) via the tunnel windows (33a, 33b) for a write operation; and applying an operation voltage to the select gate (34) and the drain (28), applying a sense voltage to the control gate (26) and keeping the two sources (35a, 35b) at a ground potential to detect current for a read operation.

With this arrangement, the erase operation, the write operation and the read operation can be properly performed on the two paired floating gates (25a, 25b) by controlling the voltages of the control gate (26), the select gate (34) and the drain (28) each shared by the two paired floating gates (25a, 25b), and the two sources (35a, 35b).

According to an inventive aspect as set forth in claim 8, there is provided a method of verifying operations of the EEPROM of claim 5 or 6, the method including the steps of: applying an operation voltage to the select gate (34) and the drain (28); applying a sense voltage to the control gate (26); opening one of the two sources (35a, 35b); and keeping the other source at a ground potential to verify an operation of one of the floating gates associated with the source kept at the ground potential.

This method makes it possible to easily verify if both of the two cells operate normally.

BRIEF DESCRIPTION OF THE DRAWINGS

FIGS. 2(A), 2(B) and 2(C) are schematic diagrams for explaining operations of the FLOTOX EEPROM of the dual cell type according to the embodiment of the present invention.

FIGS. 5(A), 5(B), 5(C) and 5(D) are circuit diagrams for explaining operations of the FLOTOX EEPROM of the dual cell structure according to the second embodiment of the present invention.

DESCRIPTION OF REFERENCE CHARACTERS

Figure 1:
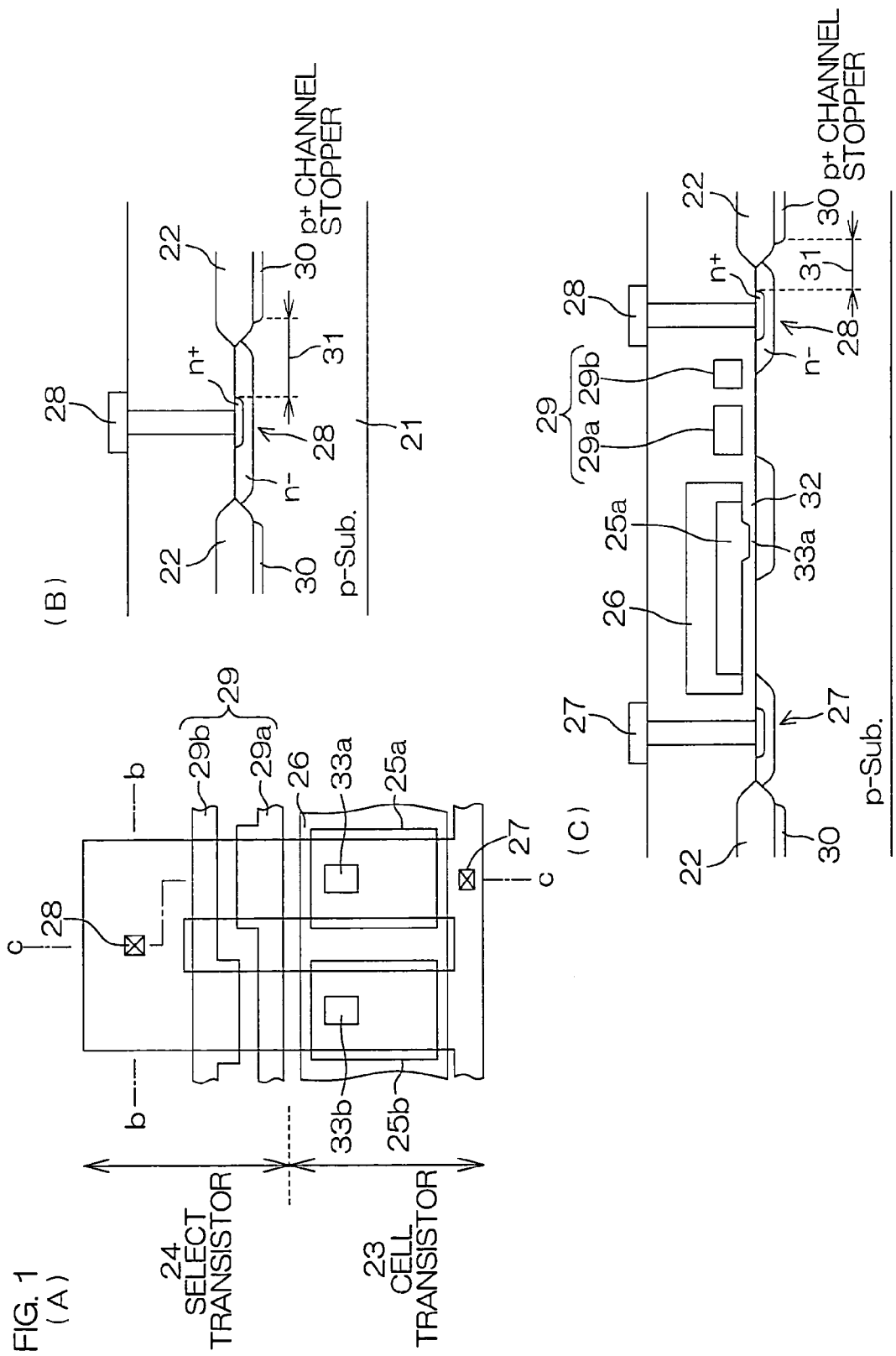
FIGS. 1(A), 1(B) and 1(C) are diagrams for explaining the construction of a FLOTOX EEPROM of a dual cell type according to one embodiment of the present invention.

21: P-type silicon substrate
22: LOCOS oxide film
23: Cell transistor
24: Select transistor
25a, 25b: Floating gates
26: Control gate (shared control gate)
27: Source (shared source)
28: Drain (shared drain)
29, 29a, 29b: Select gate
30: Channel stopper
33a, 33b: Tunnel windows
34: Select gate (shared select gate)
35a, 35b: Sources

BEST MODE FOR CARRYING OUT THE INVENTION

Embodiments of the present invention will hereinafter be described in detail with reference to the attached drawings.

FIGS. 1(A), 1(B) and 1(C) are diagrams for explaining the construction of a FLOTOX EEPROM of a dual cell type according to one embodiment of the present invention. Particularly, FIG. 1(A) is a schematic sectional view. FIG. 1(B) is a sectional view taken along a line b-b in FIG. 1(A), and FIG. 1(C) is a sectional view taken along a line c-c in FIG. 1(A).

Referring to FIGS. 1(A) to 1(C), a cell structure of the EEPROM is provided in a surface portion of a p-type silicon substrate 21 isolated by a field oxide film (LOCOS oxide film) 22 formed in the surface portion of the p-type silicon substrate 21 by a LOCOS method.

The cell structure includes a cell transistor 23 and a select transistor 24. The cell transistor 23 includes two paired floating gates 25a, 25b, a control gate 26 shared by the two floating gates 25a, 25b, and a single source 27 shared by the two floating gates 25a, 25b.

On the other hand, the select transistor 24 includes a common drain 28, and a select gate 29 provided between the drain 28 and the two floating agates 25a, 25b. The select gate 29 includes a first band line 29a and a second band line 29b each extending in a direction in which the floating gates 25a, 25b are arranged. A portion of the first band line 29a associated with the floating gate 25a has a greater width, and a portion of the second band line 29b associated with the floating gate 25a has a smaller width. Conversely, a portion of the first band line 29a associated with the floating gate 25b has a smaller width, and a portion of the second band line 29b associated with the floating gate 25b has a greater width. By providing the two lines (two word lines) for the select gate 29 and adjusting the line widths (L lengths), the floating gates 25a, 25b can function as independent cells. This will be described later.

In this embodiment, the two paired floating gates 25a, 25b are arranged generally perpendicularly to a direction extending between the drain 28 and the source 27. The source 27 and the drain 28 are shared by the two paired floating gates 25a, 25b. This reduces the size of the drain region 28, so that the drain region 28 can be spaced a predetermined distance 31 from a channel stopper region 30 provided below the LOCOS oxide film 22 for a higher breakdown voltage design.

That is, the drain region 28 of the select transistor 24 which requires the higher breakdown voltage design is shared by the two floating gates 25a, 25b, whereby the size of the drain region 28 is reduced as compared with a case in which the two cells are simply juxtaposed. Further, the cell area can be optimized by reducing the sizes of other portions of the two cells according to the breakdown voltage requirements.

Tunnel windows 33a, 33b, which are defined by smaller thickness portions of an insulating film 32 provided between the drain 28 and the two paired floating gates 25a, 25b, are respectively provided for the two paired floating gates 25a, 25b. Electrons are injected into and extracted from the floating gates 25a, 25b via the tunnel windows 33a, 33b.

The paired floating gates 25a, 25b share the control gate 26. The select gate 29 including the two lines cooperates with the control gate 26 to select the floating gate 25a or 25b. The first band line 29a and the second band line 29b of the select gate 29 respectively have a greater gate length (greater width) portion and a smaller gate length (smaller width) portion in association with the floating gate 25a. Conversely, the first band line 29a and the second band line 29b of the select gate 29 respectively have a smaller gate length (smaller width) portion and a greater gate length (greater width) portion in association with the floating gate 25b. With this arrangement, a short channel effect can be intentionally provided on the smaller gate length portions, and the floating gates 25a, 25b can be individually operated by the other portions of the band lines of the select gate free from the short channel effect. That is, the floating gates 25a, 25b can be operated as independent cells.

FIGS. 2(A), 2(B) and 2(C) are schematic diagrams for explaining operations of the EEPROM of the dual cell structure shown in FIGS. 1(A) to 1(C).

The operations of the EEPROM of the dual cell structure according to this embodiment will be described.

Write Operation

Referring to FIG. 2(A), a higher voltage (15 to 17 V) is applied to the drain 28 and the select gate 29 (29a, 29b), and the control gate 26 and the silicon substrate 21 are kept at a GND level (ground potential). Further, the source 27 is opened. Thus, electrons are extracted from the floating gates 25a, 25b due to FN tunnel current.

Erase Operation

Referring to FIG. 2(B), a higher voltage (15 to 17 V) is applied to the control gate 26 and the select gate 29 (29a, 29b), and the drain 28 and the silicon substrate 21 are kept at a GND level (ground potential). Further, the source 27 is opened. Thus, electrons are injected into the paired floating gates 25a, 25b from the drain 28 via the tunnel windows 33a, 33b.

Read Operation

Referring to FIG. 2(C), an operation voltage Vcc is applied to the drain 28 and the select gate 29 (29a, 29b). A sense voltage (a lower voltage, e.g., 1 to 3 V) is applied to the control gate 26, and the source 27 and the silicon substrate 21 are biased at a GND level (ground potential) for a read operation. Thus, the cell transistor 23 is held in an ON state or an OFF state, and data is read based on the state of the cell transistor 23.

Independent Cell Operation

Figure 3:
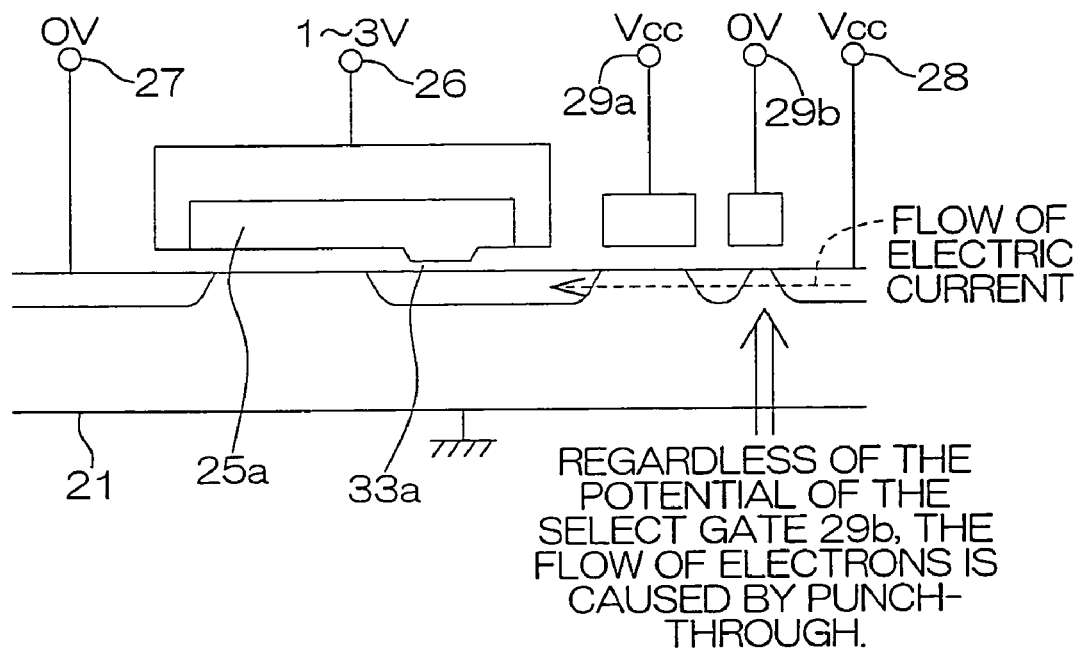
FIG. 3 is a schematic diagram for explaining voltage application for reading data from one of paired cells (floating gates 25a, 25b) regarded as independent cells.

In this embodiment, either one of the floating gates 25a, 25b is operated as an independent cell to read the data.

Where the floating gate 25a shown in FIGS. 1(A) to 1(C) is regarded as the independent cell from which the data is read, for example, the bias potentials of the source 27 and the silicon substrate 21 are kept at a GND level (ground potential) as shown in FIG. 3. Further, an operation voltage Vcc is applied to the drain 28. Then, Vcc is applied to the first band line 29a, i.e., one 29a of the band lines of the select gate 29, and the second band line 29b, i.e., the other band line 29b of the select gate 29, is kept at 0 V. At this time, punch-through occurs below the second band line 29b, because the second band line 29b has a sufficiently small gate length. Thus, the current flow of the floating gate 25a is switched on and off by applying the operation voltage Vcc to the first band line 29a, i.e., the one band line 29a of the select gate 29, regardless of the potential (0 V) of the second band line 29b.

As a result, the read operation can be performed by using either one of the paired floating gates 25a, 25b as the independent cell.

According to this embodiment, the drain region 28 of the select transistor 24 which is required to have an area sufficient for the higher breakdown voltage design is shared by the two cells, whereby the drain region 28 has a sufficient breakdown voltage and yet has a minimum area.

A consideration is given to the layout of the select gate 29 (29a, 29b). That is, the select gate 29 includes the two band lines (the first band line 29a and the second band line 29b) having different widths, whereby the floating gates 25b, 25b each function as an independent cell.

In this embodiment, the p-type and n-type conductivities of the semiconductor members may be reversed. In this case, the direction of migration of the electrons is also reversed. Further, the formation of the field oxide film may be achieved by an STI method rather than by the LOCOS method.

Figure 4:
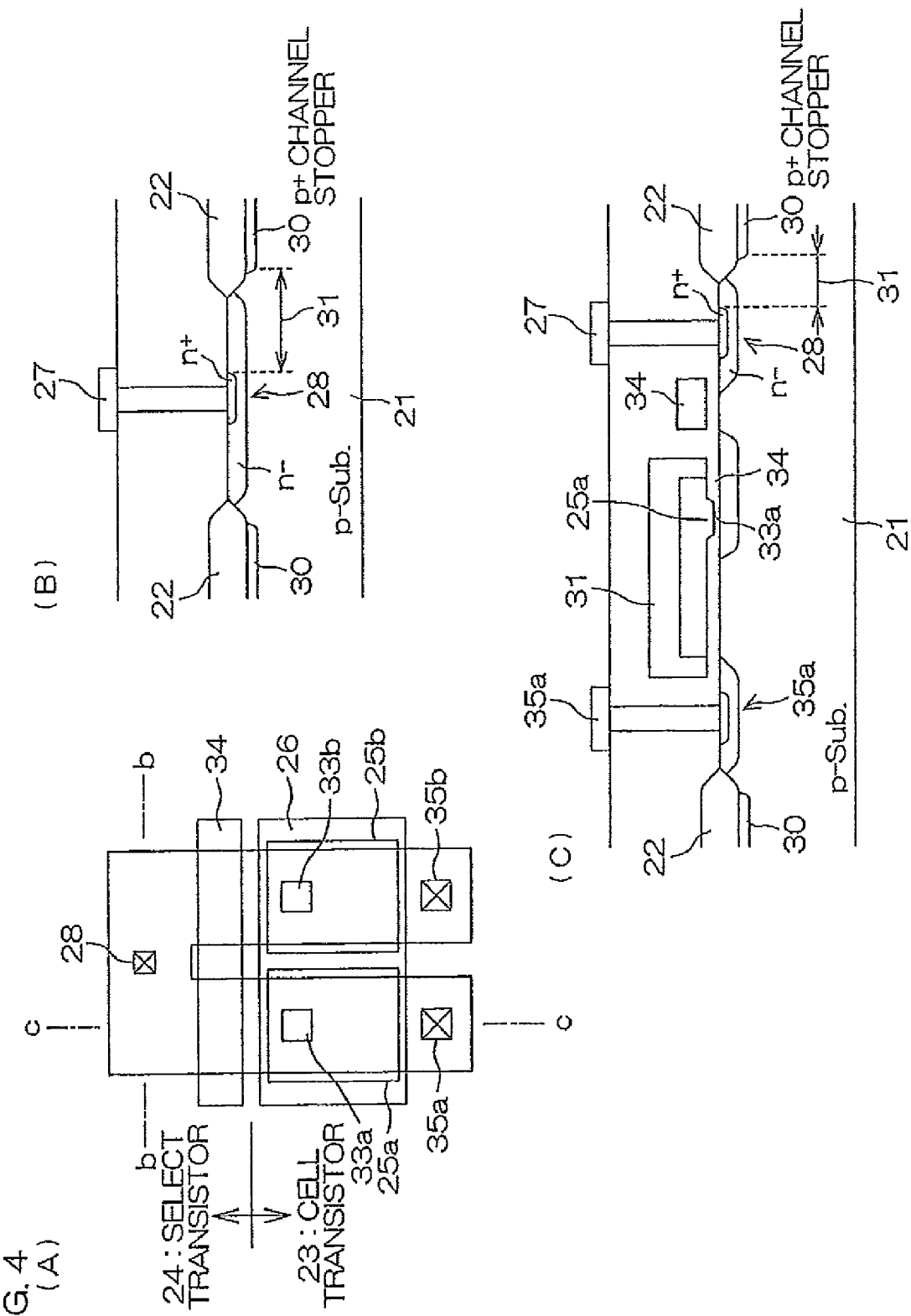
FIGS. 4(A), 4(B) and 4(C) are diagrams for explaining the construction of a FLOTOX EEPROM of a dual cell type according to a second embodiment of the present invention.
Figure 6:
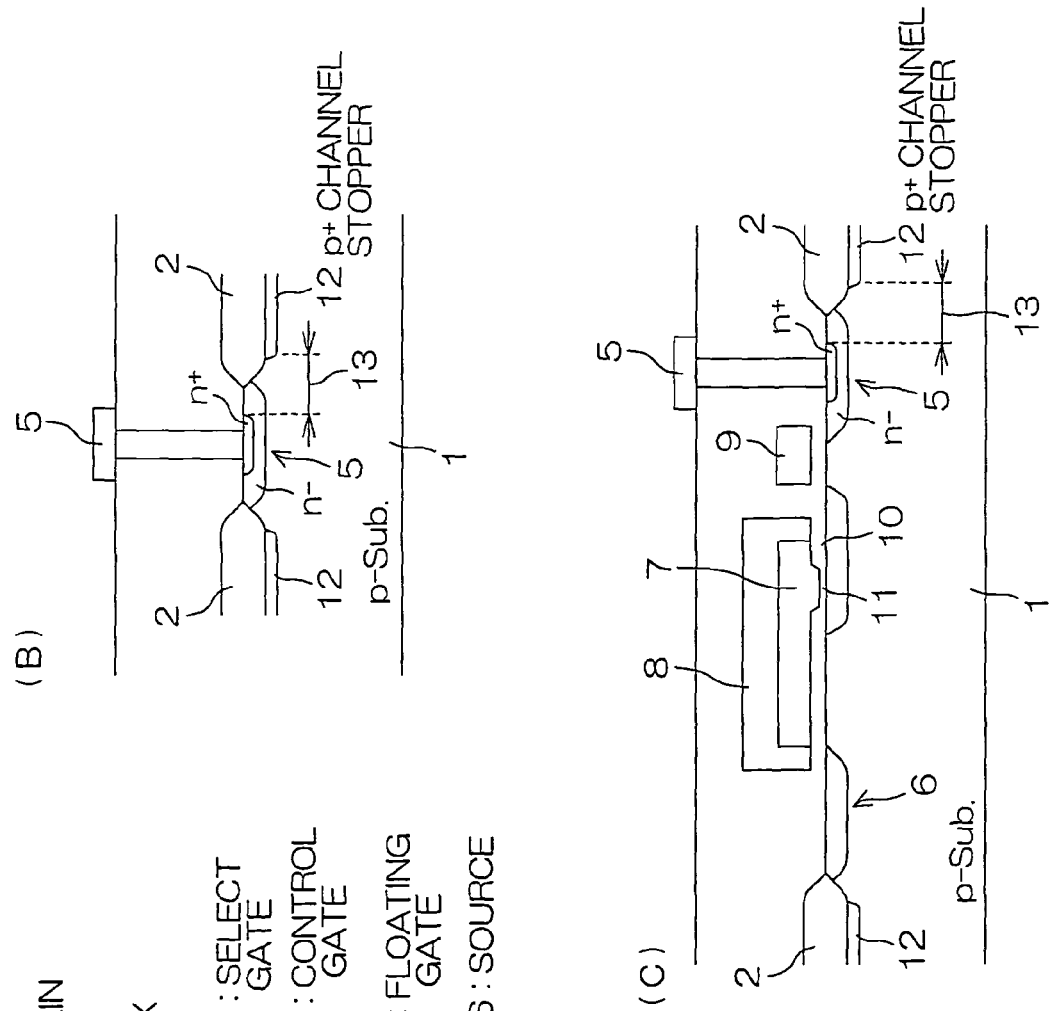
FIGS. 6(A), 6(B) and 6(C) are schematic diagrams showing a cell structure of a prior art FLOTOX EEPROM.

FIGS. 4(A), 4(B) and 4(C) are diagrams for explaining the construction of a FLOTOX EEPROM of the dual cell type according to another embodiment of the present invention. Particularly, FIG. 4(A) is a schematic plan view. FIG. 4(B) is a sectional view taken along a line b-b in FIG. 4(A), and FIG. 4(C) is a sectional view taken along a line c-c in FIG. 4(A).

A cell structure of the EEPROM is provided in a surface portion of a p-type silicon substrate 21 isolated by a field oxide film (LOCOS oxide film) 22 formed in the surface portion of the p-type silicon substrate 21 by the LOCOS method. The cell structure includes a cell transistor 23 and a select transistor 24. The cell transistor 23 includes two paired floating gates 25a, 25b and two sources 35a, 35b, which share a drain 28 provided in the select transistor 24. The two paired floating gates 25a, 25b are arranged generally perpendicularly to directions extending between the drain and the sources.

This reduces the size of the drain region 28, so that the drain region 28 can be spaced a predetermined distance 31 from a channel stopper region 30 provided below the LOCOS oxide film 22 for a higher breakdown voltage design.

Tunnel windows 33a, 33b, which are defined by smaller thickness portions of an insulating film 32 provided between the drain 28 and the two paired floating gates 25a, 25b, are provided for the two paired floating gates 25a, 25b. Electrons are injected into and extracted from the floating gates 25a, 25b via the tunnel windows 33a, 33b.

The paired floating gates 25a, 25b share a control gate 26. Further, the paired floating gates 25a, 25b share a select gate 34, which cooperates with the control gate 26 to select at least one of the two floating gates 25a, 25b.

On the other hand, the sources 35a, 35b are respectively provided for the floating gates 25a, 25b.

This arrangement reduces the size of the drain region 28, and achieves the higher breakdown voltage design. Further, the sizes of other portions of the cells can be reduced according to the breakdown voltage requirements. Therefore, the EEPROM of the dual cell structure has a sufficient breakdown voltage and yet has a minimum area.

Since the sources 35a, 35b are respectively provided for the paired floating gates 25a, 25b, the two floating gates 25a, 25b can be each driven as an independent cell from which the data is read.

FIGS. 5(A), 5(B), 5(C) and 5(D) are circuit diagrams for explaining operations of the EEPROM of the dual cell structure shown in FIGS. 4(A) to 4(C). The operations of the EEPROM of the dual cell structure according to this embodiment will hereinafter be described.

Erase Operation

Referring to FIG. 5(A), a higher voltage (e.g., 15 to 17 V) is applied to the control gate 26 and the select gate 34, and the drain 28 is kept at 0 V. Further, the sources 35a, 35b are opened. Thus, electrons are injected into the paired floating gates 25a, 25b.

Write Operation

Referring to FIG. 5(B), a higher voltage (e.g., 15 to 17 V) is applied to the drain 28 and the select gate 34. Then, the control gate 26 is kept at 0 V, and the sources 35a, 35b are opened. Thus, electrons are extracted from the paired floating gates 25a, 25b.

Read Operation (Ordinary Read Operation)

When a user uses the EEPROM, an ordinary read operation is performed in the following manner.

Referring to FIG. 5(C), an operation voltage (e.g., a power supply voltage) Vcc is applied to the select gate 34 and the drain 28, and a lower voltage (e.g., about 1 to about 2 V) called "sense voltage" is applied to the control gate 26. Then, current flowing from the drain 28 is detected with the sources 35a, 35b kept at a ground potential (GND). With electrons being injected into the floating gates 25a, 25b, the voltage Vth of the cell transistor is lower than the sense voltage, so that the current flows. With electrons being extracted from the floating gates 25a, 25b, the voltage Vth of the cell transistor is higher than the sense voltage, so that the current does not flow. Thus, the data stored in the cells can be detected.

Read Operation (Test Read Operation)

To check if the two cells properly operate before shipment, a test read operation is performed in the following manner.

Referring to FIG. 5(D), the voltages are applied to the respective gates and the drain as in the ordinary read operation described above. That is, Vcc is applied to the select gate 34 and the drain 28, and the sense voltage is applied to the control gate 26.

Here, one of the sources 35a, 35b is opened, and the other source is kept at the ground potential (GND) Thus, data can be read out of one of the floating gates 25a, 25b corresponding to the source 35a or 35b kept at the ground potential.

If the data read out of the one floating gate is equal to the data read out of the other floating gate, it is verified that the two cells properly operate.

According to this embodiment, the FLOTOX EEPROM of the dual cell type is provided, which is of a highly reliable design with a reduced cell area, and finds a wide range of applications.

In this embodiment, the p-type and n-type conductivities of the semiconductor members may be reversed. In this case, the direction of migration of the electrons is also reversed. Further, the formation of the field oxide film may be achieved by an STI method rather than by the LOCOS method.

The present invention is not limited to the embodiments described above, but various modifications may be made within the purview of the appended claims.

What is claimed is:

1. A FLOTOX EEPROM of a dual cell type which stores the same data in two cells, the FLOTOX EEPROM comprising:
   two paired floating gates;
   two tunnel windows respectively provided in association with the floating gates;
   a single control gate shared by the two floating gates;
   a select gate shared by the two floating gates and cooperative with the control gate to select the two floating gates;
   a single drain shared by the two floating gates; and
   a single source shared by the two floating gates.

2. A FLOTOX EEPROM of a dual cell type as set fourth in claim 1,
   wherein the two paired floating gates are arranged in a direction which crosses a direction extending between the drain and the source,
   wherein the select gate includes first and second band lines each extending almost parallel to the arrangement direction of the two floating gates,
   wherein the first band line includes a greater line width portion opposed to one of the two floating gates, and a smaller line width portion opposed to the other floating gate,
   wherein the second band line includes a smaller line width portion opposed to the one floating gate, and a greater line width portion opposed to the other floating gate.

3. A method of driving an EEPROM as recited in claim 2, the method comprising the, steps of:
   applying a higher voltage to the control gate and the select gate, and biasing the drain, the source and a semiconductor substrate at a lower voltage to inject electrons into the two floating gates via the tunnel windows for an erase operation;
   applying a higher voltage to the drain and the select gate, biasing the control gate and the semiconductor substrate at a lower voltage and setting the source as open state to extract electrons from the two floating gates via the tunnel windows for a write operation; and
   applying an operation voltage to the select gate and the drain, applying a sense voltage to the control gate and biasing the source and the semiconductor substrate at a ground potential to detect a current for a read operation.

4. A method of driving an EEPROM as recited in claim 2, comprising the step of performing a read operation on one of the two floating gates by biasing the source and a semiconductor substrate at a ground potential, applying an operation voltage to the drain, applying the ground potential to one of the first band line and the second band line, and applying an operation voltage to the other band line.

5. A method of driving an EEPROM as recited in claim 1, the method comprising the steps of:
   applying a higher voltage to the control gate and the select gate, and biasing the drain, the source and a semiconductor substrate at a lower voltage to inject electrons into the two floating gates via the tunnel windows for an erase operation;
   applying a higher voltage to the drain and the select gate, biasing the control gate and the semiconductor substrate at a lower voltage and setting the source as open state to extract electrons from the two floating gates via the tunnel windows for a write operation; and
   applying an operation voltage to the select gate and the drain, applying a sense voltage to the control gate and biasing the source and the semiconductor substrate at a ground potential to detect a current for a read operation.

6. A FLOTOX EEPROM of a dual cell type which stores the same data in two cells, the FLOTOX EEPROM comprising:
   two paired floating gates;
   two tunnel windows respectively provided in association with the floating gates;
   a single control gate shared by the two floating gates;
   a single select gate shared by the two floating gates and cooperative with the control gate to select the two floating gates;
   a single drain shared by the two floating gates; and
   two sources respectively provided in association with the floating gates.

7. A FLOTOX EEPROM of a dual cell type as set forth in claim 6, wherein the two paired floating gates are arranged in a direction which crosses directions extending between the drain and the sources.

8. A method of driving an EEPROM as recited in claim 7, the method comprising the steps of:
   applying a higher voltage to the control gate and the select gate, keeping the drain at a lower voltage, and setting the source as open state to inject electrons into the two floating gates via the tunnel windows for an erase operation;
   applying a higher voltage to the drain and the select gate, keeping the control gate at a lower voltage and setting the source as open state to extract electrons from the two floating gates via the tunnel windows for a write operation; and
   applying an operation voltage to the select gate and the drain, applying a sense voltage to the control gate and keeping the two sources at a ground potential to detect a current for a read operation.

9. A method of verifying an operation of an EEPROM as recited in claim 7, the method comprising the steps of:
   applying an operation voltage to the select gate and the drain;
   applying a sense voltage to the control gate;
   setting the source as open state; and
   keeping the other source at a ground potential to verify an operation of one of the floating gates associated with the source kept at the ground potential.

10. A method of driving an EEPROM as recited in claim 6, the method comprising the steps of:
    applying a higher voltage to the control gate and the select gate, keeping the drain at a lower voltage, and setting the source as open state to inject electrons into the two floating gates via the tunnel windows for an erase operation;
    applying a higher voltage to the drain and the select gate, keeping the control gate at a lower voltage and setting the source as open state to extract electrons from the two floating gates via the tunnel windows for a write operation; and
    applying an operation voltage to the select gate and the drain, applying a sense voltage to the control gate and keeping the two sources at a ground potential to detect a current for a read operation.

11. A method of verifying an operation of an EEPROM as recited in claim 6, the method comprising the steps of:
    applying an operation voltage to the select gate and the drain;
    applying a sense voltage to the control gate;
    setting the source as open state; and
    keeping the other source at a ground potential to verify an operation of one of the floating gates associated with the source kept at the ground potential.

* * * * *